United States Patent [19]
Arthur et al.

[11] Patent Number: 5,384,181
[45] Date of Patent: Jan. 24, 1995

[54] LOW VOLUME FRACTION CERAMIC FILLED FLUOROPOLYMERIC COMPOSITE MATERIAL

[75] Inventors: David J. Arthur, Norwood; Gwo S. Swei, Northboro, both of Mass.; Allen F. Horn, III, Danielson; Brett Kilhenny, Storrs, both of Conn.

[73] Assignee: Rogers Corporation, Rogers, Conn.

[21] Appl. No.: 131,870

[22] Filed: Oct. 5, 1993

Related U.S. Application Data

[63] Continuation of Ser. No. 641,427, Jan. 17, 1991, abandoned, which is a continuation-in-part of Ser. No. 367,241, Jun. 16, 1989, Pat. No. 5,061,548, which is a continuation-in-part of Ser. No. 15,191, Feb. 17, 1987, Pat. No. 4,849,284, and a continuation-in-part of Ser. No. 279,474, Dec. 2, 1988, Pat. No. 5,149,590.

[51] Int. Cl.$^6$ .............................................. B32B 9/00
[52] U.S. Cl. .................................. 428/195; 428/325; 428/331; 428/421; 428/422; 428/405; 428/461; 428/901; 428/447; 174/256
[58] Field of Search ............... 428/325, 331, 405, 421, 428/422, 461, 447, 901; 174/68.5

[56] References Cited

U.S. PATENT DOCUMENTS

| | | | |
|---|---|---|---|
| 2,539,329 | 1/1951 | Sanders et al. | 117/65 |
| 3,025,185 | 3/1962 | Schmidt | 428/268 |
| 3,421,972 | 1/1969 | Cromwell et al. | 161/189 |
| 3,787,281 | 1/1974 | Effenberger | 161/188 |
| 4,036,807 | 7/1977 | Atherton | 260/42.15 |
| 4,335,180 | 6/1982 | Traut | 428/303 |
| 4,337,155 | 6/1982 | Sasaki et al. | 210/500.1 |
| 4,513,055 | 4/1985 | Leibowitz | 428/285 |
| 4,647,508 | 3/1987 | Gazit et al. | 428/421 |
| 4,725,504 | 2/1988 | Knudsen et al. | 428/458 |
| 4,886,699 | 12/1989 | Carroll et al. | 428/228 |

FOREIGN PATENT DOCUMENTS 57-134806 8/1982 Japan.

OTHER PUBLICATIONS

"Silane Coupling Agents", Plueddemann 1982, New York.
"Metal-Surfaced and other Fluorocarbon Combinations", Electrical Manufacturing, Mar. 1952.
"Making a Good Product Better", Malvern Minerals Company.
"A Guide to Dow Corning Silane Coupling Agents", Dow Corning Corporation, 1985.
"Silane Coupling Agents in Mineral-Reinforced Elastomers", Union Carbide Corporation, 1974.
"Silane Adhesion Promoters in Mineral-Filled Composites", Union Carbide Corporation, 1973.
"Handbook of Fillers and Reinforcements for Plastics", Van Nostrand Reinhold Company, 1978.
"The Use of Mixed Silane Coupling Agents", Plueddemann et al, 1985.

*Primary Examiner*—Patrick J. Ryan
*Assistant Examiner*—Elizabeth Evans
*Attorney, Agent, or Firm*—Fishman, Dionne & Cantor

[57] ABSTRACT

A composite material is presented comprised of a ceramic filled fluoropolymer wherein the ceramic is coated with a silane and the ceramic has a volume % fraction of between about 26–45. The composite of this invention exhibits excellent chemical resistance, particularly to alkaline environments. Preferably, the silane comprises a blend of at least one phenyl silane and at least one fluorosilane. The silane is preferably coated to a level of 10% of the total weight of ceramic filler.

45 Claims, 3 Drawing Sheets

LOW VOLUME FRACTION CERAMIC FILLED FLUOROPOLYMERIC COMPOSITE MATERIAL

This is a continuation of copending application(s) Ser. No. 07/641,427 filed on Jan. 17, 1991, now abandoned, which is a continuation-in-part of U.S. application Ser. No. 367,241 filed Jun. 16, 1989, now U.S. Pat. No. 5,061,548, (which, in turn, is a continuation-in-part of U.S. application Ser. No. 015,191 filed Feb. 17, 1987, now U.S. Pat. No. 4,849,284) and a continuation-in-part of U.S. application Ser. No. 279,474 filed Dec. 2, 1988, and U.S. Pat. No. 5,149,590.

BACKGROUND OF THE INVENTION

This invention relates to a fluoropolymeric composite material. More particularly, this invention relates to a fluoropolymeric composite material which is particularly well suited for use as a bonding ply in a multilayer circuit board and in other electronic circuit applications requiring the ability to flow as well as good thermal, mechanical and electrical properties. The fluoropolymeric composite material of this invention also exhibits resistance to chemical degradation, particularly high pH (alkaline) environments.

U.S. Pat. No. 4,849,284, which is assigned to the assignee hereof and incorporated herein by reference, describes a ceramic filled fluoropolymer-based electrical substrate material sold by Rogers Corporation under the trademark RO-2800. This electrical substrate material preferably comprises polytetrafluoroethylene filled with silica along with a small amount of microfiberglass. In an important feature of this material, the ceramic filler (silica) is coated with a silane coating material which renders the surface of the ceramic hydrophobic and provides improved tensile strength, peel strength and dimensional stability. The composite material of U.S. Pat. No. 4,849,284 discloses a volume % filler fraction (on a void free basis) of at least 50 for use as a circuit substrate or a bonding ply.

The ceramic filled fluoropolymer-based electrical substrate material of U.S. Pat. No. 4,849,284 is well suited for forming rigid printed wiring board substrate materials and exhibits improved electrical performance over other printed wiring board materials. Also, the low coefficients of thermal expansion and compliant nature of this electrical substrate material results in improved surface mount reliability and plated through-hole reliability. As is known, individual sheets of this electrical substrate material may be stacked to form a multilayer circuit board. In fact, thin film formulations of the material disclosed in U.S. Pat. No. 4,849,284 (and sold by Rogers Corporation under the trademark RO-2810) may be used as a bonding ply to bond together a plurality of stacked substrate layers so as to form the multilayer circuit board.

It will be appreciated that high volume fractions (greater than 55 volume %) of ceramic filler will significantly and adversely effect the rheology (e.g. flow) of the ceramic filled fluoropolymer composite. This is particularly important when the composite is used as a bonding film or in filling openings in previously rigid structures. While ceramic filler volume fractions of 50–55% provide significantly improved rheological properties relative to higher filler fractions, there is a perceived need to provide even better flow properties to the fluoropolymeric composite without appreciably altering the excellent thermal, mechanical and electrical properties.

In addition to the adverse effects on rheology, it has also been determined that ceramic filler volume fractions of 50% and greater also have an adverse impact on the chemical resistance of the filled fluoropolymeric composite with respect to certain hostile environments, particularly high pH (alkaline) baths. Such high pH baths (e.g., greater than pH=12) are required for electroless copper deposition, which is a highly desirable and often used process in the manufacture of fine line circuitry (i.e., multichip modules). It has been found that high levels (50 volume % and greater) of ceramic filler may impart poor chemical resistance to the fluoropolymeric circuit material during long exposures in such alkaline baths. The resultant degradation caused by the poor resistance to the alkaline baths leads to a reduction in the hydrophobicity of the fluoropolymeric composite. In turn, this reduction leads to increased moisture absorption with a corresponding and highly undesirable decrease in the electrical properties of the composite circuit material.

SUMMARY OF THE INVENTION

In U.S. Ser. No. 367,241 filed Jun. 16, 1989, now U.S. Pat. No. 5,061,548 (assigned to the assignee hereof and fully incorporated herein by reference) it had been discovered that the ceramic filler content of the material disclosed in U.S. Pat. No. 4,849,284 may be as low as 45 volume % on a void-free basis and still retain adequate thermal, mechanical and electrical properties to be used as a bonding ply in multilayer circuit materials and as a filling material for certain rigid structures. The ceramic filled fluoropolymeric composite material of U.S. Ser. No. 367,241 has improved rheology relative to the material of U.S. Pat. No. 4,849,284 and is useful in those applications requiring access holes and feature filling by resin flow without an excessive increase in the material's z-axis CTE.

In accordance with the present invention, it has now been discovered that the serious chemical degradation associated with the high filler content (e.g., 50% and greater) fluoropolymer composites of U.S. Pat. No. 4,849,284 during long exposure to high pH baths is reduced and/or alleviated by employing lower filler levels of as low as about 26 volume % on a void free basis. The resultant ceramic filled composite has excellent mechanical and electrical properties; and exhibits a significant improvement (relative to composites of higher filler levels) in alkaline resistance. Accordingly, the present invention relates to a filled fluoropolymer composite containing 26–45 volume % silane coated ceramic.

In accordance with another important feature of this invention, it has been discovered that relatively large amounts of silane coating of up to 2–10% (of the total weight of the ceramic filler) leads to improved properties, particularly with respect to laser drilling for forming plated throughholes and solid post vias. The use of 10% (and preferably 6%) coating is surprising and unexpected as it had been generally believed (as described in U.S. Pat. No. 4,849,284) that silane levels should be between 1 to 2%; and that no appreciable improvements were obtained in high levels of up to 6–10%.

Thus, in accordance with this second feature of the present invention, improved properties are provided from an electrical substrate material comprising a fluoropolymeric matrix filled with ceramic filler in an amount of at least about 26 volume percent of the total substrate material with the ceramic filler being coated with a silane coating in an amount of greater than 2 to about 10 weight percent relative to the weight of the ceramic filler.

The preferred silane coating comprises a blend of phenylsilane and fluorosilane. This combination imparts excellent chemical resistance to alkaline baths and also promotes laser drilling capability. Also, the combination of the relatively less expensive phenylsilane and the more expensive fluorosilane provides an extremely cost effective coating.

The above-discussed and other features and advantages of the present invention will be appreciated and understood by those of ordinary skill in the art from the following detailed description and drawings.

BRIEF DESCRIPTION OF THE DRAWING

Referring now to the drawings.

DESCRIPTION OF THE PREFERRED EMBODIMENT

Figure 1A:
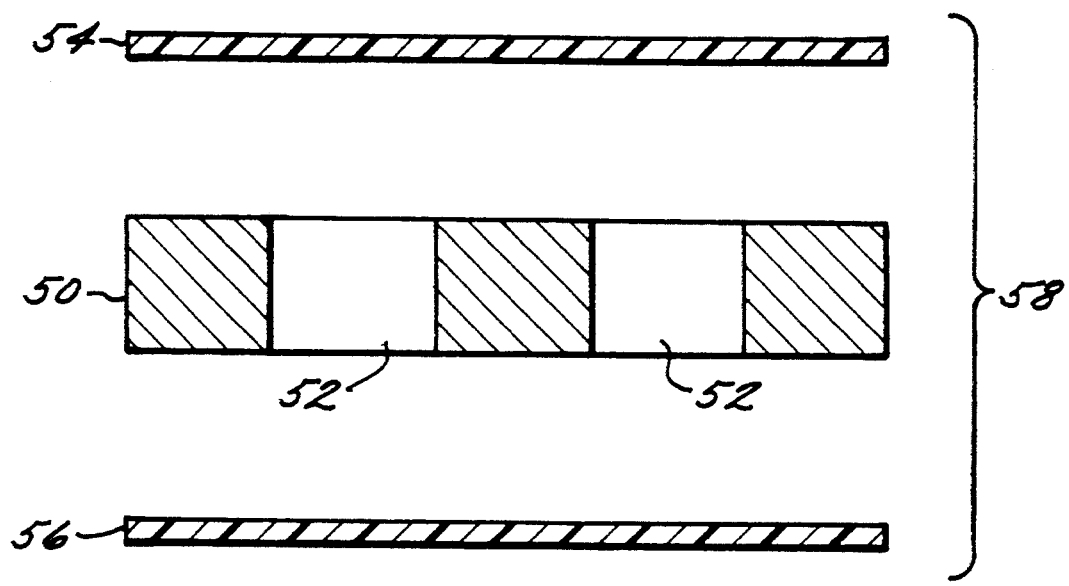
FIG. 1A and 1B are respective cross-sectional elevation views of a rigid structure having openings prior and subsequent to being filled with the composite material of the present invention.

The ceramic filled fluoropolymeric composite of the present invention is substantially similar to the composite described in U.S. Pat. No. 4,849,284 and U.S. Ser. No. 367,241 (both of which have been fully incorporated herein by reference) with the exception that (1) in a first embodiment, the ceramic is present on a void-free basis in an amount of as low as about 26 volume %; and. (2) in a second embodiment, the ceramic filler is coated with up to 10% silane (with respect to the total weight of the ceramic filler). All of these embodiments preferably utilize a blend of phenylsilane and fluorosilane for coating the ceramic filler.

In a preferred embodiment, the first embodiment of the present invention comprises a composite of particulate ceramic filler present at a volume fraction of about 0.26 to less than 0.45 and fluoropolymer (e.g. PTFE) present at a volume fraction of 0.74 to 0.55 on a void-free basis. The preferred ceramic filler is fused amorphous silica. All other compositional features and methods of manufacture are the same as that disclosed in U.S. Pat. No. 4,849,284 (including the ceramic being coated with a silane) with the exception of preferred higher weight percents of silane coating and the preferred silane blends, both of which will be described hereinafter. Accordingly, reference is to be made to U.S. Pat. No. 4,849,284 for those details. The materials comprising the present invention can be produced either by "wet blending" PTFE polymer in dispersion with the ceramic filler and coagulation or by dry blending of PTFE fine powders with the ceramic filler.

The reduction in filler content to as low as about 26 volume % leads to significant increase in the resistance of the fluoropolymer composite material to alkaline environments. In the comparison of Examples 1 and 2 shown in Table 1 below, Example 1 is a composite of the type described in U.S. Pat. No. 4,849,284 having a composition of 50% PTFE fluoropolymer, 50% silica filler and a phenyl silane filler coating of 2 weight %. Example 2 is a composition in accordance with the present invention having a composition of 37.1% silica filler, 62.9% PTFE fluoropolymer and a blend of phenyl and fluoro-silanes (3:1 ratio) of 6 weight % (with respect to the total filler weight).

TABLE 1

|  | Example 1 | Example 2 |
|---|---|---|
| Xylene Absorption (%) | 5.3 | 2.7 |
| H$_2$O Absorption (%) | .05 | .02 |
| H$_2$O Absorption* (%) | 1.7 | .07 |
| Insulation Resistance** (M ohm) | 90 | greater than 300 |
| CTE (ppm °C.) | 40 | 60 |
| Laser Ablation Threshold (J/cm$^2$) | 1.7 | 1.3 |

*After 24 hours in 0.1M NaOH, 1% Triton, 23° C.
**After 8 hours in 0.1M NaOH, 1% Triton, 60° C.

The results of Table 1 clearly show that H$_2$O absorption (after treatment in an alkaline bath) significantly decreases with decreased filler amount (e.g., 0.07% for the present invention versus 1.7% for the material of U.S. Pat. No. 4,849,284). It will be appreciated that acceptable H$_2$O absorption should be less than about 0.1%. The results of Table 1 are verified in the additional Examples 3-12 of Table 2. In Examples 6-11, the silane coating comprises a blend of phenyl silane and fluorosilane. Example 12 utilizes a phenyl silane coating.

TABLE 2

| Example | SILICA %/ SILANE % | SP. GRAV | INITIAL[1] H$_2$O Absorption (%) | Conditioned[2] H$_2$O Absorption |
|---|---|---|---|---|
| 3 | 30/0 DRY | 2.2047 | 0.5152 | 0.5895 |
| 4 | 40/0 DRY | 2.1970 | 1.1160 | 1.2474 |
| 5 | 50/0 DRY | 2.1452 | 2.3566 | 2.0443 |
| 6 | 29.3 DRY | 2.1971 | 0.0435 | 0.0428 |
| 7 | 39 DRY | 2.1800 | 0.0361 | 0.0886 |
| 8 | 48.6 DRY | 2.1201 | 0.0774 | 0.4099 |
| 9 | 27.9 DRY | 2.1859 | 0.0458 | 0.0500 |
| 10 | 37.1 DRY | 2.1654 | 0.0140 | 0.0727 |
| 11 | 46.1 DRY | 2.1163 | 0.0613 | 0.5869 |

TABLE 2-continued

| Example | SILICA %/ SILANE % | SP. GRAV | INITIAL[1] H₂O Absorption (%) | Conditioned[2] H₂O Absorption |
|---------|---------|---------|---------|---------|
| 12 | 48.6 DRY CONTROL | 2.1130 | 0.0400 | 1.7640 |

[1]$H_2O$ absorption (24 hours, 50° C.) with no alkaline bath pre-conditioning
[2]$H_2O$ absorption (24 hours, 50° C.) after 24 hours in 0.1M NaOH, 1% Triton, 23° C.

Table 2 again shows that decreasing filler content leads to an increase in chemical resistance to high pH treatment as evidenced by the decrease in water absorption with decreasing filler content. A comparison of Examples having equal silane coatings (such as Examples 3-5, 6-8 and 9-11) show that the increased chemical resistance is provided, at least in part, by the lower filler levels. It will be appreciated that the low levels (e.g., 27 and 37 volume %) in accordance with the present invention are significantly improved with respect to the 50 volume % levels associated with composite of U.S. Pat. No. 4,849,284. Thus, a filled fluoropolymeric circuit material composite of this invention having a filler level of about 26 (note that Table 3 depicts examples having filler contents down to about 26 volume %) to less than 45 volume % provide significant advantage relative to the material of both U.S. Ser. No. 367,241 (filler levels of 45 to less than 50 volume %) and U.S. Pat. No. 4,849,284 (filler levels of 50 volume % and greater).

Figure 4:
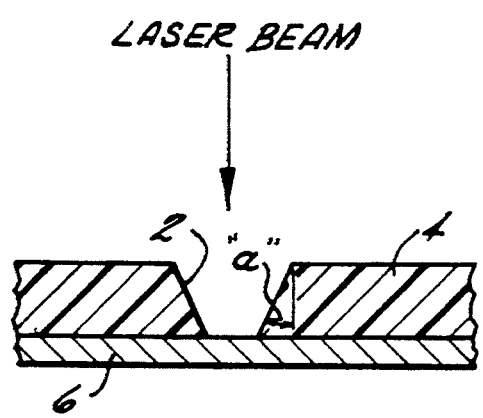
FIG. 4 is a cross-sectional elevation view of a circuit board in accordance with the present invention.

In accordance with still another feature of this invention, it has been found that higher coating levels of up to 10% (and preferably 6%) by weight of the total ceramic filler contributes to improved laser ablation results. This discovery is unexpected as it had been believed and suggested in U.S. Pat. No. 4,849,284 that silane coating levels of 1 to 2% were preferred, and that above 2%, the effect of the silane coating is negligible. Two criteria used in determining laser ability of circuit materials include (1) the energy level required for ablation (lower levels are preferred); and (2) the deviation from perfectly straight (no taper) ablated hole walls (with 0 degrees deviation being preferred). FIG. 4 shows the cross-section of a circuit board having a laser abalted hole 2 formed in a substrate 4 (made from the composite of this invention) having a layer of copper 6 thereon. The angle "a" represents the deviation from a straight wall. Table 3 shows the laser ablation results for an array of coating amounts and ceramic filler amounts for dry and wet blended compositions. Examples 13-30 and 32-38 use silica filler while Examples 31 and 39 use quartz filler.

TABLE 3

LASER ABLATION THRESHOLD AT 248 nm FOR VARIOUS PTFE/CERAMIC COMPOSITIONS

| Example | Blend Method | Filler Content | Coating | Filler Size | Ablation Threshold (J/cm²) |
|---------|---------|---------|---------|---------|---------|
| 13 | DRY | 46.1 | 6% 3:1 | 10u | 1.3 |
| 14 | WET | 46.1 | 6% 3:1 | 10u | 1.3 |
| 15 | WET | 37.1 | 6% 3:1 | 10u | 1.3 |
| 16 | WET | 43.8 | 10% 3:1 | 1.5u | 1.3 |
| 17 | DRY | 37.1 | 6% 3:1 | 10u | 1.3 |
| 18 | DRY | 27.9 | 6% 3:1 | 10u | 1.7 |
| 19 | WET | 35.3 | 10% 3:1 | 1.5u | 1.7 |
| 20 | WET | 27.9 | 6% 3:1 | 10u | 1.7 |
| 21 | WET | 26.7 | 10% 3:1 | 1.5u | 1.7 |
| 22 | WET | 48.6 | 2% 3:1 | 10u | 1.7 |
| 23 | DRY | 48.6 | 2% 6124 | 10u | 1.7 |
| 24 | DRY | 48.6 | 2% 6124 | 10u | 1.7 |
| 25 | DRY | 48.6 | 2% 3:1 | 10u | 1.7 |
| 26 | DRY | 39.0 | 2% 3:1 | 10u | 1.7 |

TABLE 3-continued

LASER ABLATION THRESHOLD AT 248 nm FOR VARIOUS PTFE/CERAMIC COMPOSITIONS

| Example | Blend Method | Filler Content | Coating | Filler Size | Ablation Threshold (J/cm²) |
|---------|---------|---------|---------|---------|---------|
| 27 | WET | 39.0 | 2% 3:1 | 10u | 2.7 |
| 28 | WET | 48.6 | 2% 3:1 | 10u | 2.7 |
| 29 | DRY | 48.6 | 2% 3:1 | 10u | 2.7 |
| 30 | DRY | 39.0 | 2% 3:1 | 10u | 2.7 |
| 31 | DRY | 29.3 | 2% 6124 | Quartz | 2.7 |
| 32 | DRY | 29.3 | 2% 3:1 | 10u | 2.7 |
| 33 | WET | 29.3 | 2% 3:1 | 10u | 2.7 |
| 34 | WET | 35.3 | 10% 3:1 | 1.5u | 2.7 |
| 35 | WET | 40% | Untreated | 10u | 3.9 |
| 36 | DRY | 50% | Untreated | 10u | 3.9 |
| 37 | WET | 30% | Untreated | 10u | 3.9 |
| 38 | DRY | 30% | Untreated | 10u | 3.9 |
| 39 | DRY | 30% | Untreated | Quartz | 3.9 |

The results of Table 3 indicate that high filler levels and high coating amounts provide the best laser ablation results (in terms of the lowest ablation threshold energy). Laser ablation results worsen as either filler level, or coating level, or both go down. The filler coating can significantly reduce ablation threshold, even for low filler levels such as 26%. This is quite evident when examples 18 and 20 are compared with example 36. In Table 3, coatings indicated by the ratio 3:1 are three parts phenyl silane to one part fluorosilane. The coating identified as 6124 is phenyl trimethoxy silane and the fluorosilane is tridecafluoro-1,1,2,2-tetrahydrooctyl-1-triethoxysilane having a chemical formula of $C_6F_{13}CH_2CH_2Si(OCH_2CH_3)_3$ and hereinafter referred to as $C_6F$.

Figure 3:
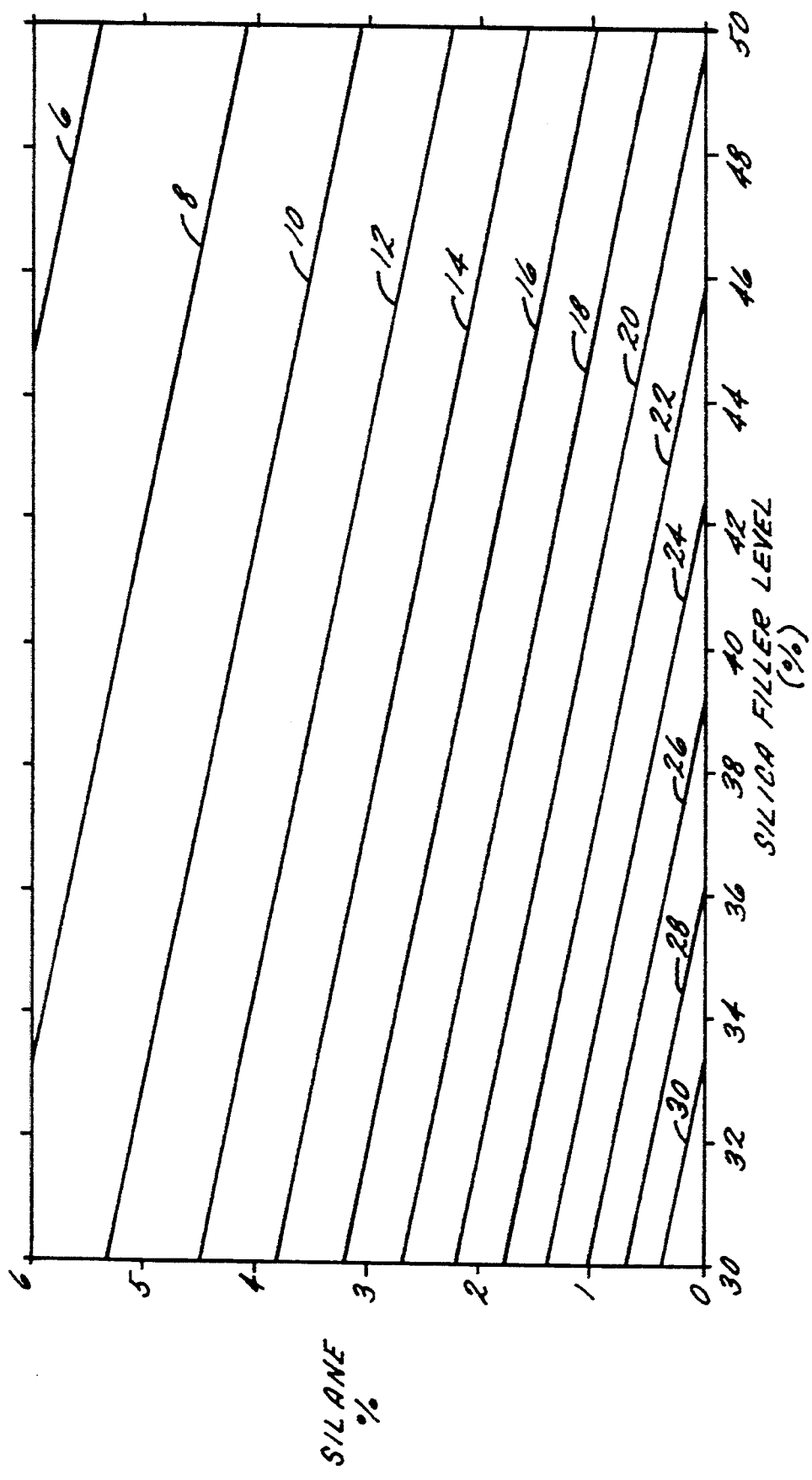
FIG. 3 is a graph showing the effect of silane and coated silica filler level (%) on laserability of the composite material at 248 nm, 3.9J/cm$^2$ beam energy.

This effect of composition on laserability (at 248 nm for 3.9 J/cm² beam energy) is also shown in FIG. 3 where the diagonal lines represent the derivation from straight of a lased hole walls (with the lower angle being preferred). In FIG. 3, the "Silica Filler Levels" include the volume % contibuted by the silane coating. FIG. 3 indicates that higher silane amounts and/or higher ceramic filler amounts lead to improved laser ablation (hole wall quality). Note that low levels of ceramic filler preferably use high levels of silane. Thus, in accordance with this second feature of the present invention, improved properties are provided from an electrical substrate material comprising a fluoropolymeric matrix filled with ceramic filler in an amount of at least about 26 volume percent of the total substrate material with the ceramic filler being coated with a silane coating in an amount of greater than 2 to about 10 weight percent relative to the weight of the ceramic filler.

In accordance with still another feature of this invention, it has been found that the silane coating is preferably a blend of phenylsilane and fluorosilane. The fluorosilane imparts chemical resistance to alkaline exposure while the phenylsilane promotes laser drilling; and is less expensive than the fluorosilane. Table 4 demonstrates the superiority of fluorosilane to phenylsilane in imparting resistance to alkaline degradation. The preferred blend is phenylsilane to fluorosilane in weight ratio of 3:1. Examples of suitable phenylsilanes and fluorosilanes are described in detail in U.S. application Ser. No. 279,474 filed Dec. 2, 1988, assigned to the assignee hereof and fully incorporated herein by reference.

Figure 1B:
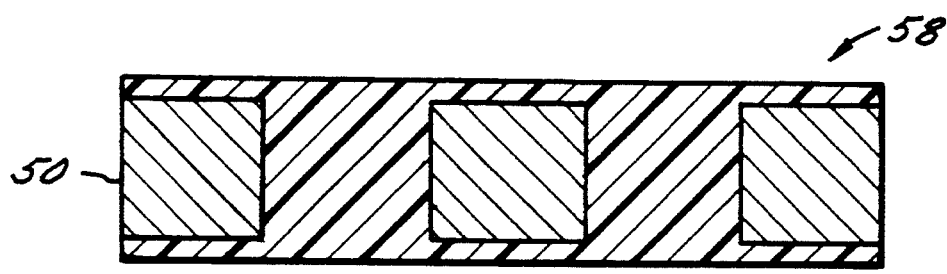

Similarly, the rigid structure of FIG. 1B may comprise the fluoropolymeric composite described hereinabove having higher amounts of silane coating. Thus, this rigid structure would comprise an electrical substrate material comprising a fluoropolymeric matrix filled with ceramic filler in an amount of at least about 26 volume percent of the total substrate material with

TABLE 4

| EXAMPLE | FILLER CONTENT (%) | BLEND METHOD | SILANE TYPE % | SILANE LEVEL | SpG | INITIAL[1] H$_2$O ABSORPTION (%) | CONDITIONED[2] H$_2$O ABSORPTION (%) |
| --- | --- | --- | --- | --- | --- | --- | --- |
| 40 | 48.6 | DRY | C6F | 2 | 2.142 | 0.03 | 0.33 |
| 41 | 47.3 | DRY | C6F | 4 | 2.143 | 0.04 | 0.41 |
| 42 | 46.1 | DRY | C6F | 6 | 2.139 | 0.04 | 0.50 |
| 43 | 47.3 | DRY | 6124 | 4 | 2.097 | 0.02 | 0.99 |

[1]H$_2$O Absorption (48 hrs., 50° C.) without alkaline preconditioning.
[2]H$_2$O Absorption (48 hrs., 50° C.) after 24 hrs. in 0.1M aqueous NaOH, 1 weight % Triton X-100, 23° C.

By this reduction in filler content, the rheology of the material of the present invention is improved to the point that it will "flow" and fill comparatively large openings in thick metal foils or inner layers of circuitry that cannot be filled by some of the highly filled (greater than 55 volume % fraction) materials disclosed in U.S. Pat. No. 4,849,284.

An important feature of the present invention is the fact that the rheology is improved without excessively increasing the Z-axis coefficient of thermal expansion (CTE) of the material. The Z-axis CTE of the 30–45 volume % filler formulation has been measured to be considerably less than the widely used fiber reinforced PTFE over the temperature range of −55° to +125° C. (typically about 200 ppm/° C.) (see Table 5). Multilayer circuit boards made from RO 2800 laminate bonded together with bonding ply layers of the present invention will exhibit an overall CTE considerably lower than that of a fiber reinforced PTFE board. The decreased CTE is important in increasing the reliability of plated through holes and vias to withstand thermal cycling and high temperature assembly.

TABLE 5

| Example | Material Silane %/Filler % | −55/+125 ppm/°C. |
| --- | --- | --- |
| 44 | 2/30 | 94 |
| 45 | 2/40 | 68 |
| 46 | 2/50 | 41 |
| 47 | 6/30 | 84 |
| 48 | 6/40 | 72 |
| 49 | 6/50 | 47 |

The present invention extends the number of applications in which ceramic filled PTFE composite materials can be used for constructing useful printed wiring boards. The present invention has the particular utility in filling openings in already rigid structures, such as etched CIC voltage or ground planes and restraining cores, or circuitry bonded to such structures. For example, in FIG. 1A, a rigid ground plane structure is depicted in cross-section at 50 several having openings 52. Sheets 54, 56 of the present invention (e.g., about 0.26 to 0.45 volume fraction ceramic) are then positioned on either side of ground plane 50. In FIG. 1B, the stack-up 58 of FIG. 1A is laminated under heat and pressure. The composition of this invention will permit good flow so as to completely fill the openings while also providing excellent thermal, mechanical and electrical properties. As shown in FIG. 1B, the composite material of this invention not only fills openings 52, but in addition may completely envelope or surround substrate 50.

the ceramic filler being coated with a silane coating in an amount of greater than 2 to about 10 weight percent relative to the weight of the ceramic filler.

Figure 2:
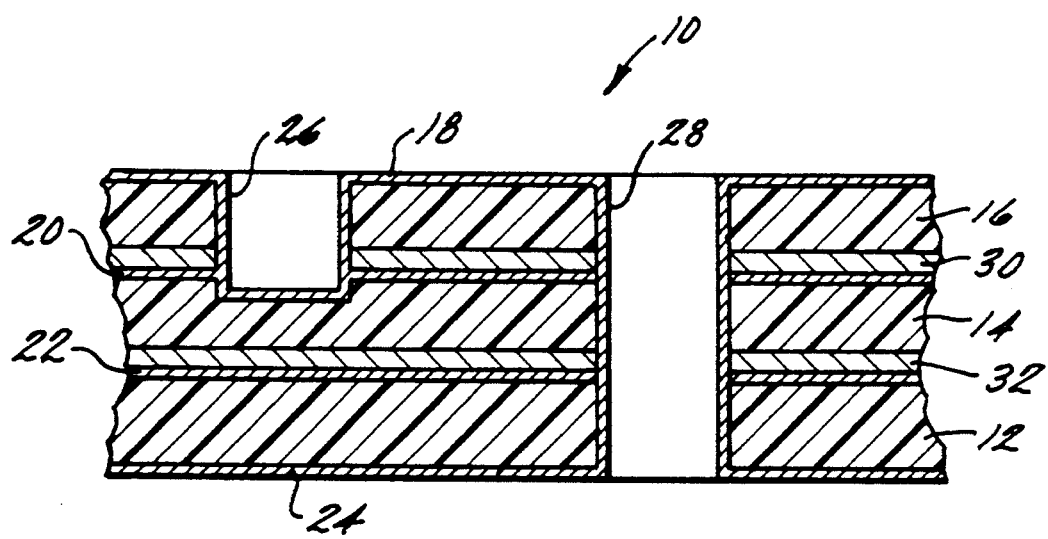
FIG. 2 is a cross-sectional elevation view of a multilayer circuit board employing the thermoplastic composite material in accordance with the present invention as a thin film bonding ply.

In addition and referring to FIG. 2, the composite of this invention may be processed into a sheet in its undensified, unsintered form and used for bonding multilayer printed wiring boards or constructing printed wiring boards by foil lamination. Turning now to FIG. 2, such a multilayer circuit board is shown generally at 10. Multilayer board 10 comprises a plurality of layers of substrate material 12, 14 and 16, all of which are comprised of an electrical substrate material, preferably the ceramic filled fluoropolymeric material of U.S. Pat. No. 4,849,284 sold under the RO-2800 trademark. Each substrate layer 12, 14 and 16 has a conductive pattern 18, 20, 22 and 24 respectively thereon. Note that a substrate layer having a circuit pattern thereon defines a circuit substrate. Plated through holes 26 and 28 interconnect selected circuit patterns in a known manner.

In accordance with the present invention, separate sheets 30 and 32 of substrate material having a composition in accordance with the present invention are used as an adhesive or bond ply to laminate individual circuit substrates together. In a preferred method of forming such a laminate, a stack-up of circuit substrates altered with one or more layers of the bond ply is made. This stack-up is then fusion bonded whereby the entire multilayer assembly is melted and fused into a homogeneous construction with consistent electrical and mechanical properties throughout. Significantly, note that the adhesive bond ply layers 30 and 32 may be used to laminate circuit substrates comprised of materials other than the silane coated ceramic filled fluoropolymer of U.S. Pat. No. 4,849,284. Although, in a preferred embodiment, a multilayer circuit board includes circuit substrates which are all comprised of the electrical substrate material of U.S. Pat. No. 4,849,284.

Similarly, the multilayer laminated circuit material of FIG. 2 may comprise the fluoropolymeric composite described hereinabove having higher amounts of silane coating. Thus, this multilayer laminated circuit material would comprise an amount of at least about 26 volume percent of the total substrate material with the ceramic filler being coated with a silane coating in an amount of greater than 2 to about 10 weight percent relative to the weight of the ceramic filler.

The highly filled composites referred to in U.S. Pat. No. 4,849,284 (e.g. 50+ vol % filler) are very suitable for most printed wiring board designs (e.g., large multilayer boards for mainframe computers (CPU boards), military surface mount assemblies and microwave circuit board bonded assemblies). However, for special MLB applications requiring thick voltage planes relative to the dielectric thickness (e.g., thick power planes, thick restraining foils for CTE control), a lower filler content is required (e.g., 45–50 vol %) to provide adequate flow, as indicated in aforementioned U.S. Ser. No. 367,241 (now U.S. Pat. No. 5,061,548). The lower filler amounts of about 26% to less than 45% in accordance with this invention is a response to the evolution of circuit process technology for the fabrication of multi chip modules which specifically require laser drilling of small holes, good flow, and alkaline resistance for electroless baths. The low filler amounts of this invention may not make a good conventional Multilayer Board (as will the material described in U.S. Pat. No. 4,849,284), but the material of U.S. Pat. No. 4,849,284 is not suitable for certain multi chip module applications which are emerging as a preferred packaging technology for high speed high density designs.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electrical substrate material comprising:
   fluoropolymeric material;
   ceramic filler material, said ceramic filler material including fused amorphous silica, said filler material being in an amount of at least about 26 to less than 45 volume percent of the total substrate material; and
   said ceramic filler being coated by a silane coating.

2. The material of claim 1 including:
   at least one layer of conductive material being disposed on at least a portion of said electrical substrate material.

3. The material of claim 1 wherein said fluoropolymeric material is selected from the group comprising:
   polytetrafluoroethylene, hexa fluoropropene, tetrafluoroethylene or perfluoro alkyl vinyl ether.

4. The material of claim 1 wherein said silane coating is selected from the group comprising:
   p-chloromethyl phenyl trimethoxy silane, amino ethyl amino trimethoxy silane, a mixture of phenyl trimethoxy silane and amino ethyl amino propyl trimethoxy silane, fluorosilane and a blend of at least one fluorosilane and at least one phenylsilane.

5. The material of claim 1 wherein said silane coating is in an amount of greater than 2 to about 10 weight percent relative to the weight of the ceramic filler.

6. The material of claim 5 wherein:
   said silane coating comprises a blend of at least one fluorosilane and at least one phenylsilane.

7. The material of claim 1 wherein:
   said conductive material comprises metal.

8. In a multilayer circuit including at least a first circuit layer and a second circuit layer, the improvement comprising:
   an adhesive layer sandwiched between the first and second circuit layers, said adhesive layer comprising;
   fluoropolymeric material;
   ceramic filler material, said ceramic filler material including fused amorphous silica, said filler material being in an amount of at least about 26 to less than 45 volume percent of the total adhesive layer; and
   said ceramic filler being coated with a silane coating.

9. The multilayer circuit of claim 8 including:
   at least one plated through hole.

10. The multilayer circuit of claim 8 wherein said fluoropolymeric material is selected from the group comprising:
    polytetrafluoroethylene, hexa fluoropropene, tetrafluoroethylene or perfluoro alkyl vinyl ether.

11. The multilayer circuit of claim 8 wherein said silane coating is selected from the group comprising:
    p-chloromethyl phenyl trimethoxy silane, amino ethyl amino trimethoxy silane, a mixture of phenyl trimethoxy silane, amino ethyl amino propyl trimethoxy silane, fluorosilane and a blend of at least one fluorosilane and at least one phenylsilane.

12. The material of claim 8 wherein said silane coating is in an amount of greater than 2 to about 10 weight percent relative to the weight of the ceramic filler.

13. The material of claim 12 wherein:
    said silane coating comprises a blend of at least one fluorosilane and at least one phenylsilane.

14. The material of claim 8 wherein:
    said conductive material comprises metal.

15. An article comprising:
    a substrate, said substrate having at least one opening at least partially through said substrate;
    a composite material in said at least one opening, said composite material including;
    fluoropolymeric material;
    ceramic filler material, said filler material being in an amount of at least about 26 to less than 45 volume percent of the total composite material; and
    said ceramic filler being coated by a silane coating.

16. The article of claim 15 wherein said fluoropolymeric material is selected from the group comprising:
    polytetrafluoroethylene, hexa fluoropropene, tetrafluoroethylene or perfluoro alkyl vinyl ether.

17. The article of claim 15 wherein said ceramic filler comprises silica.

18. The article of claim 15 wherein said silane coating is selected from the group comprising:
    p-chloromethyl phenyl trimethoxy silane, amino ethyl amino trimethoxy silane, a mixture of phenyl trimethoxy silane and amino ethyl amino propyl trimethoxy silane, fluorosilane and a blend of at least one fluorosilane and at least one phenylsilane.

19. The article of claim 15 wherein said silane coating is in an amount of greater than 2 to about 10 weight percent relative to the weight of the ceramic filler.

20. The article of claim 19 wherein:
    said silane coating comprises a blend of at least one fluorosilane and at least one phenylsilane.

21. The material of claim 15 wherein:
    said conductive material comprises metal.

22. The article of claim 15 wherein:
    said substrate comprises a rigid substrate.

23. The article of claim 15 wherein:
    said composite material completely surrounds said substrate.

24. An electrical substrate material comprising:
    fluoropolymeric material;
    ceramic filler material, said filler material being in an amount of at least about 26 volume percent of the total substrate material; and
    said ceramic filler being coated by a silane coating, said silane coating being in an amount of greater than 2 to about 10 weight percent relative to the weight of the ceramic filler.

25. The material of claim 24 wherein:
said silane coating comprises a blend of at least one fluorosilane and at least one phenylsilane.

26. The material of claim 7 wherein:
said ceramic filler comprises silica.

27. The material of claim 26 wherein:
said silica comprises fused amorphous silica.

28. In a multilayer circuit including at least a first circuit layer and a second circuit layer, the improvement comprising:
an adhesive layer sandwiched between the first and second circuit layers, said adhesive layer comprising:
fluoropolymeric material;
ceramic filler material, said filler material being in an amount of at least about 26 volume percent of the total adhesive layer; and
said ceramic filler being coated with a silane coating, said silane coating being in an amount of greater than 2 to about 10 weight percent relative to the weight of the ceramic filler.

29. The material of claim 28 wherein:
said silane coating comprises a blend of at least one fluorosilane and at least one phenylsilane.

30. The multilayer circuit of claim 26 wherein:
said ceramic filler comprises silica.

31. The multilayer circuit of claim 30 wherein:
said silica comprises fused amorphous silica.

32. An article comprising:
a rigid substrate, said rigid substrate having at least one opening at least partially through said substrate;
a composite material in said at least one opening, said composite material including;
fluoropolymeric material;
ceramic filler material, said filler material being in an amount of at least about 26 volume percent of the total composite material; and
said ceramic filler being coated by a silane coating, said silane coating being in an amount of greater than 2 to about 10 weight percent relative to the weight of the ceramic filler.

33. The material of claim 32 wherein:
said silane coating comprises a blend of at least one fluorosilane and at least one phenylsilane.

34. The article of claim 30 wherein:
said ceramic filler comprises silica.

35. The article of claim 34 wherein:
said silica comprises fused amorphous silica.

36. An electrical substrate material comprising:
fluoropolymeric material, said fluoropolymeric material comprising polytetrafluoroethylene;
fused amorphous silica particulate filler material, said filler material being in an amount of at least about 26 to less than 45 volume percent of the total substrate material;
said fused amorphous silica filler being coated by a silane coating; and
at least one layer of metal being disposed on at least a portion of said electrical substrate material.

37. The material of claim 36 wherein said metal comprises copper.

38. An article comprising:
a substrate, said substrate having at least one opening at least partially through said substrate;
a composite material in said at least one opening, said composite material including;
fluoropolymeric material;
ceramic filler material, said ceramic filler material including fused amorphous silica, said filler material being in an amount of at least about 26 to less than 45 volume percent of the total composite material; and
said ceramic filler being coated by a silane coating.

39. The material of claim 38 wherein said fluoropolymeric material is selected from the group comprising:
polytetrafluoroethylene, hexa fluoropropene, tetrafluoroethylene or perfluoro alkyl vinyl ether.

40. The material of claim 38 wherein said silane coating is selected from the group comprising:
p-chloromethyl phenyl trimethoxy silane, amino ethyl amino trimethoxy silane, a mixture of phenyl trimethoxy silane and amino ethyl amino propyl trimethoxy silane, fluorosilane and a blend of at least one fluorosilane and at least one phenylsilane.

41. The material of claim 38 wherein said silane coating is in an amount of greater than 2 to about 10 weight percent relative to the weight of the ceramic filler.

42. The material of claim 41 wherein:
said silane coating comprises a blend of at least one fluorosilane and at least one phenylsilane.

43. The article of claim 38 wherein:
said substrate comprises a rigid substrate.

44. The article of claim 38 wherein:
said composite material completely surrounds said substrate.

45. An article comprising:
a substrate, said substrate having a plurality of openings through said substrate;
a composite material in said openings, said composite material including;
fluoropolymeric material, said fluoropolymeric material comprising polytetrafluoroethylene;
ceramic filler material, said ceramic filler material including fused amorphous silica, said filler material being in an amount of at least about 26 to less than 45 volume percent of the total composite material;
said ceramic filler being coated by a silane coating; and
said composite material filling said openings and completely surrounding said substrate.

* * * * *

UNITED STATES PATENT AND TRADEMARK OFFICE
CERTIFICATE OF CORRECTION

PATENT NO.     : 5,384,181 C1
DATED          : March 15, 2005
INVENTOR(S)    : David J. Arthur et al.

It is certified that error appears in the above-identified patent and that said Letters Patent is hereby corrected as shown below:

<u>Title page and the heading for columns 1 and 2,</u>
"5,384,181 C1" should be -- 5,384,181 C2 --.

Signed and Sealed this

Thirty-first Day of May, 2005

JON W. DUDAS
*Director of the United States Patent and Trademark Office*

US005384181B1

REEXAMINATION CERTIFICATE (4102nd)

United States Patent [19]
Arthur et al.

[11] B1 5,384,181
[45] Certificate Issued Jun. 13, 2000

[54] LOW VOLUME FRACTION CERAMIC FILLED FLUOROPOLYMERIC COMPOSITE MATERIAL

[75] Inventors: David J. Arthur, Norwood; Gwo S. Swei, Northboro, both of Mass.; Allen F. Horn, III, Danielson; Brett Kilhenny, Storrs, both of Conn.

[73] Assignee: World Properties, Inc., Lincolnwood, Ill.

Reexamination Request:
No. 90/005,294, Mar. 16, 1999

Reexamination Certificate for:
Patent No.: 5,384,181
Issued: Jan. 24, 1995
Appl. No.: 08/131,870
Filed: Oct. 5, 1993

Related U.S. Application Data

[63] Continuation of application No. 07/641,427, Jan. 17, 1991, abandoned, which is a continuation-in-part of application No. 07/367,241, Jun. 16, 1989, Pat. No. 5,061,548, which is a continuation-in-part of application No. 07/015,191, Feb. 17, 1987, Pat. No. 4,849,284, which is a continuation-in-part of application No. 07/279,474, Dec. 2, 1988, Pat. No. 5,149,590.

[51] Int. Cl.[7] ..................................... B32B 9/00
[52] U.S. Cl. .......................... 428/195; 428/325; 428/331; 428/405; 428/421; 428/422; 428/461; 428/447; 428/901; 174/256
[58] Field of Search ..................................... 428/195, 325, 428/331, 405, 421, 422, 461, 447, 901; 174/256

[56] References Cited

U.S. PATENT DOCUMENTS

| | | |
|---|---|---|
| 3,340,222 | 9/1967 | Fang . |
| 3,928,703 | 12/1975 | Cook . |
| 4,134,848 | 1/1979 | Adicoff et al. .......................... 252/63.2 |
| 4,151,154 | 4/1979 | Berger . |
| 4,181,154 | 1/1980 | Berger .................................... 260/40 R |
| 4,391,930 | 7/1983 | Olson . |
| 4,469,747 | 9/1984 | Sasaki et al. . |
| 4,529,774 | 7/1985 | Evans et al. ............................. 524/860 |
| 5,055,342 | 10/1991 | Markovich . |
| 5,126,192 | 6/1992 | Chellis . |

OTHER PUBLICATIONS

MIL–P–13949F, Military Specification, Plastic Sheet, Laminated, Metal Clad (For Printied Wiring Boards), Mar. 1981.
Murray Olyphant, Jr. and thomas E. Nowicki, "Microwave Substrates Support MIC Technology", Microwave Tech Topics and Microwave Magazine, Nov. 1980.
Rogers Corp. v Arlon, Inc. 855 F. Supp. 560, Mar. 1981.
MIL–P–13949F, Military Specification, Plastic Sheet, Laminated, Metal Clad (For Printed Wiring Boards), General Specification For (Mar. 10, 1981)(superseding MIL–P–13949E (Jul. 15, 1971), MIL–P–55636B (Sep. 10, 1976), and MIL–P–55617B (Sep. 10, 1976).
Murray Olyphant, Jr. & Thomas E. Nowicki, "Microwave Substrates Support MIC Technology", in *Microwave Tech Topics*, also published in *Microwave Magazine*, Nov./Dec. 1980.
Reissue U.S. Patent No. 4,849,284, Declarationnof Bruce Kosa.
Tri–Pure R–900 Literature.
Sample 3M Product Literature.

*Primary Examiner*—Elizabeth Evans

[57] ABSTRACT

A composite material is presented comprised of a ceramic filled fluoropolymer wherein the ceramic is coated with a silane and the ceramic has a volume % fraction of between about 26–45. The composite of this invention exhibits excellent chemical resistance particularly to alkaline environments. Preferably, the silane comprises a blend of at least one phenyl silane and at least one fluorosilane. The silane is preferably coated to a level of 10% of the total weight of ceramic filler.

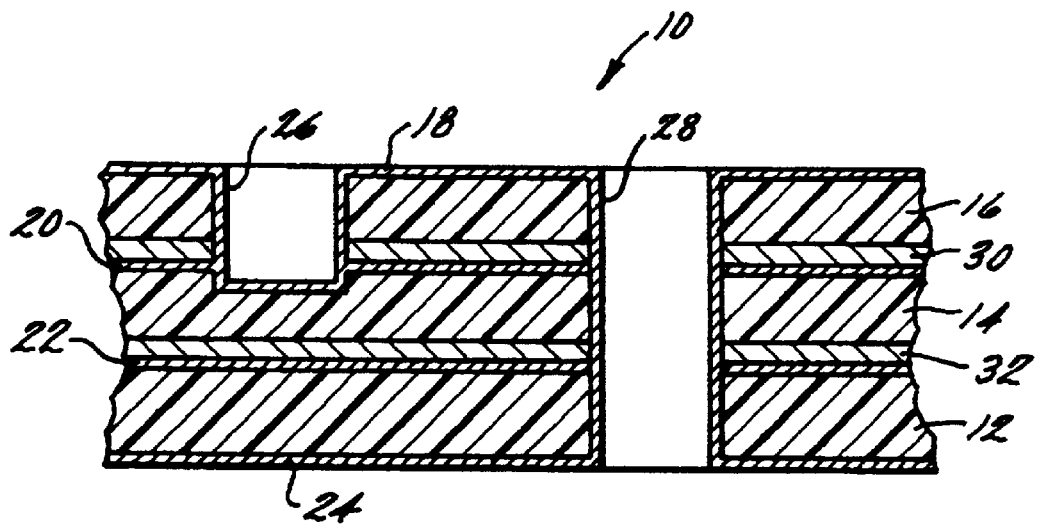

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 8–14, 24–25, 28–29, 32–33, and 36–37 are confirmed.

Claims 1, 3, 15–17, 23, 38–39 and 44–45 are cancelled.

Claims 2, 4, 5, 7, 18–22 and 40–43 are determined to be patentable as amended.

Claims 6, 26, 27, 30, 31, 34 and 35, dependent on an amended claim, are determined to be patentable.

2. [The material of claim 1 including:] *An electrical substrate material comprising:*
*fluoropolymeric material;*
*ceramic filler material, said ceramic filler material including fused amorphous silica, said filler material being in an amount of at least about 26 to less than 45 volume percent of the total substrate material;*
*said ceramic filler being coated by a silane coating; and*
*at least one layer of conductive material being disposed on at least a portion of said electrical substrate material.*

4. [The material of claim 1 wherein said silane coating is] *An electrical substrate material comprising:*
*fluoropolymeric material;*
*ceramic filler material, said ceramic filler material including fused amorphous silica, said filler material being in an amount of at least about 26 to less than 45 volume percent of the total substrate material; and*
*said ceramic filler being coated by a silane coating, said* [silane] *coating is* selected from the group comprising[:] p-chloromethyl phenyl trimethoxy silane, amino ethyl amino trimethoxy silane, a mixture of phenyl trimethoxy silane and amino ethyl amino propyl trimethoxy silane, fluorosilane and a blend of at least one fluorosilane and at least one phenylsilane.

5. [The material of claim 1 wherein said silane coating is] *An electrical substrate material comprising:*
*fluoropolymeric material;*
*ceramic filler material, said ceramic filler material including fused amorphous silica, said filler material being in an amount of at least about 26 to less than 45 volume percent of the total substrate material; and*
*said ceramic filler being coated by a silane coating, said silane coating being* in an amount of greater than 2 to about 10 weight percent relative to the weight of the ceramic filler.

7. [The material of claim 1 wherein:] *An electrical substrate material comprising:*
*fluoropolymeric material;*
*ceramic filler material, said ceramic filler material including fused amorphous silica, said filler material being in an amount of at least about 26 to less than 45 volume percent of the total substrate material;*
*said ceramic filler being coated by a silane coating; and*
*at least one layer of conductive material being disposed on at least a portion of said electrical substrate material,* said conductive material [comprises] *comprising* metal.

18. [The article of claim 15 wherein] *An article comprising:*
*a substrate, said substrate having at least one opening at least partially through said substrate;*
*a composite material in said at least one opening, said composite material including;*
*fluoropolymeric material;*
*ceramic filler material, said filler material being in an amount of at least about 26 to less than 45 volume percent of the total composite material; and*
*said ceramic filler being coated by a silane coating,* said silane coating [is] *being* selected from the group comprising:
p-chloromethyl phenyl trimethoxy silane, amino ethyl amino trimethoxy silane, a mixture of phenyl trimethoxy silane and amino ethyl amino propyl trimethoxy silane, fluorosilane and a blend of at least one fluorosilane and at least one phenylsilane.

19. [The article of claim 15 wherein] *An article comprising:*
*a substrate, said substrate having at least one opening at least partially through said substrate;*
*a composite material in said at least one opening, said composite material including;*
*fluoropolymeric material;*
*ceramic filler material, said filler material being in an amount of at least about 26 to less than 45 volume percent of the total composite material; and*
*said ceramic filler being coated by a silane coating,* said silane coating [is] *being* in an amount of greater than 2 to about 10 weight percent relative to the weight of the ceramic filler.

20. [The article of claim 19 wherein:] *An article comprising:*
*a substrate, said substrate having at least one opening at least partially through said substrate;*
*a composite material in said at least one opening, said composite material including;*
*fluoropolymeric material;*
*ceramic filler material, said filler material being in an amount of at least about 26 to less than 45 volume percent of the total composite material; and*
*said ceramic filler being coated by a silane coating,* said silane coating [comprises] *comprising* a blend of at least one fluorosilane and at least one phenylsilane.

21. [The material of claim 15 wherein:] *An article comprising:*
*a substrate, said substrate having at least one opening at least partially through said substrate;*
*a composite material in said at least one opening, said composite material including;*
*fluoropolymeric material;*
*ceramic filler material, said filler material being in an amount of at least about 26 to less than 45 volume percent of the total composite material;*
*said ceramic filler being coated by a silane coating; and* at least one layer of conductive material being disposed on at least a portion of said electrical substrate material, said conductive material [comprises] comprising metal.

22. [The article of claim 15 wherein:
said substrate comprises] *An article comprising:*
a rigid substrate, *said substrate having at least one opening at least partially through said substrate;*
*a composite material in said at least one opening, said composite material including;*
*fluoropolymeric material;*
*ceramic filler material, said filler material being in an amount of at least about 26 to less than 45 volume percent of the total composite material; and*
*said ceramic filler being coated by a silane coating.*

40. [The material of claim 38 wherein] *An article comprising:*
*a substrate, said substrate having at least one opening at least partially through said substrate;*
*a composite material in said at least one opening, said composite material including;*
*fluoropolymeric material;*
*ceramic filler material, said ceramic filler material including fused amorphous silica, said filler material being in an amount of at least about 26 to less than 45 volume percent of the total composite material; and*
*said ceramic filler being coated by a silane coating,* said silane coating is selected from the group comprising: p-chloromethyl phenyl trimethoxy silane, amino ethyl amino trimethoxy silane, a mixture of phenyltrimethoxy silane and amino ethyl amino propyl trimethoxy silane, fluorosilane and a blend of at least one fluorosilane and at least one phyenylsilane.

41. [The material of claim 38 wherein] *An article comprising;*
*a substrate, said substrate having at least one opening at least partially through said substrate;*
*a composite material in said at least one opening, said composite material including;*
*fluoropolymeric material;*
*ceramic filler material, said ceramic filler material including fused amorphous silica, said filler material being in an amount of at least about 26 to less than 45 volume percent of the total composite material; and*
*said ceramic filler being coated by a silane coating,* said silane coating is in an amount of greater than 2 to about 10 weight percent relative to the weight of the ceramic filler.

42. [The material of claim 41 wherein:] *An article comprising:*
*a substrate, said substrate having at least one opening at least partially through said substrate;*
*a composite material in said at least one opening, said composite material including;*
*fluoropolymeric material;*
*ceramic filler material, said ceramic filler material including fused amorphous silica, said filler material being in an amount of at least about 26 to less than 45 volume percent of the total composite material; and*
*said ceramic filler being coated by a silane coating,* said silane coating comprises a blend of at least one fluorosilane and at least one phenylsilane.

43. [The article of claim 38 wherein:] *An article comprising:*
*a substrate, said substrate having at least one opening at least partially through said substrate;*
*a composite material in said at least one opening, said composite material including;*
*fluoropolymeric material;*
*ceramic filler material, said ceramic filler material including fused amorphous silica, said filler material being in an amount of at least about 26 to less than 45 volume percent of the total composite material; and*
*said ceramic filler being coated by a silane coating,* said substrate comprises a rigid substrate.

* * * * *

(12) EX PARTE REEXAMINATION CERTIFICATE (5081st)
United States Patent
Arthur et al.

(10) Number: US 5,384,181 C1
(45) Certificate Issued: Mar. 15, 2005

(54) LOW VOLUME FRACTION CERAMIC FILLED FLUOROPOLYMERIC COMPOSITE MATERIAL

(75) Inventors: David J. Arthur, Norwood, MA (US);
Gwo S. Swei, Northboro, MA (US);
Allen F. Horn, III, Danielson, CT (US); Brett Kilhenny, Storrs, CT (US)

(73) Assignee: World Properties, Inc., Lincolnwood, IL (US)

Reexamination Request:
No. 90/006,734, Aug. 4, 2003

Reexamination Certificate for:
Patent No.: 5,384,181
Issued: Jan. 24, 1995
Appl. No.: 08/131,870
Filed: Oct. 5, 1993

Related U.S. Application Data

(63) Continuation of application No. 07/641,427, filed on Jan. 17, 1991, now abandoned, which is a continuation-in-part of application No. 07/367,241, filed on Jun. 16, 1989, now Pat. No. 5,061,548, which is a continuation-in-part of application No. 07/279,474, filed on Dec. 2, 1988, now Pat. No. 5,149,204, and a continuation-in-part of application No. 07/015,191, filed on Feb. 17, 1987, now Pat. No. 4,849,204.

(51) Int. Cl.[7] .................................................. B32B 9/00

(52) U.S. Cl. ...................... 428/195.1; 174/256; 428/325; 428/331; 428/405; 428/421; 428/422; 428/447; 428/461; 428/901; 257/23.007 E

(58) Field of Search ....................... 174/256; 428/195.1, 428/325, 331, 405, 421, 422, 461, 447, 901; 257/23.007 E

(56) References Cited

U.S. PATENT DOCUMENTS

| 2,976,093 A | 3/1961 | Reiling |
| 5,061,548 A | 10/1991 | Arthur et al. |
| 5,126,192 A | 6/1992 | Chellis et al. |

FOREIGN PATENT DOCUMENTS

EP        265839        10/1987

*Primary Examiner*—Bruce Hess

(57) ABSTRACT

A composite material is presented comprised of a ceramic filled fluoropolymer wherein the ceramic is coated with a silane and the ceramic has a volume % fraction of between about 26–45. The composite of this invention exhibits excellent chemical resistance, particularly to alkaline environments. Preferably, the silane comprises a blend of at least one phenyl silane and at least one fluorosilane. The silane is preferably coated to a level of 10% of the total weight of ceramic filler.

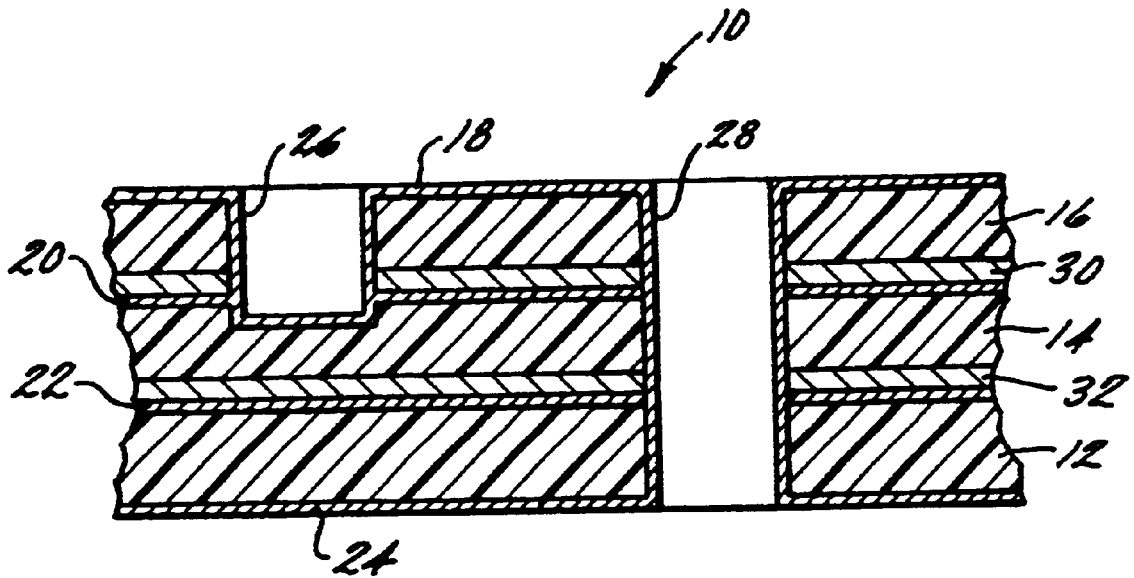

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2, 4–14, 18–22, 24–37 and 40–43 is confirmed.

Claims 1, 3, 15–17, 23, 38, 39, 44 and 45 were previously cancelled.

20. [The article of claim 19 wherein:] *An article comprising:*
  *a substrate, said substrate having at least one opening at least partially through said substrate;*
  *a composite material in said at least one opening, said composite material including;*
  *fluoropolymeric material;*
  *ceramic filler material, said filler material being in an amount of at least about 26 to less than 45 volume percent of the total composite material; and*
  *said ceramic filler being coated by a silane coating,* said silane coating [comprises] *comprising* a blend of at least one fluorosilane and at least one phenylsilane.

* * * * *